United States Patent
Yu et al.

(10) Patent No.: US 7,930,618 B2
(45) Date of Patent: Apr. 19, 2011

(54) OUTER ENCODER AND OUTER ENCODING METHOD THEREOF

(75) Inventors: Jung-pil Yu, Suwon-si (KR); Hae-joo Jeong, Seoul (KR); Eui-jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1282 days.

(21) Appl. No.: 11/504,029

(22) Filed: Aug. 15, 2006

(65) Prior Publication Data
US 2007/0092028 A1    Apr. 26, 2007

Related U.S. Application Data

(60) Provisional application No. 60/788,707, filed on Apr. 4, 2006, provisional application No. 60/739,448, filed on Nov. 25, 2005, provisional application No. 60/738,050, filed on Nov. 21, 2005, provisional application No. 60/734,295, filed on Nov. 8, 2005, provisional application No. 60/728,777, filed on Oct. 21, 2005.

(30) Foreign Application Priority Data

Jul. 20, 2006    (KR) .................. 10-2006-0068053

(51) Int. Cl.
*H03M 13/00* (2006.01)
(52) U.S. Cl. .................. 714/786; 714/788; 714/790
(58) Field of Classification Search .................. 714/786, 714/788, 701, 755, 790, 792, 787
See application file for complete search history.

(56) References Cited

U.S. PATENT DOCUMENTS 5,428,646 A * 6/1995 Eyuboglu ............. 375/354
(Continued)

FOREIGN PATENT DOCUMENTS

CN    1543219    11/2004
(Continued)

OTHER PUBLICATIONS

International Search Report and Written Opinion of the International Searching Authority re: International Application No. PCT/KR2006/004295 (12 pp).

(Continued)

*Primary Examiner* — Fritz Alphonse
(74) *Attorney, Agent, or Firm* — Sughrue Mion, PLLC (57) ABSTRACT

An outer encoder includes a bit detector that receives a turbo stream provided with a parity insertion region and that detects data bits from the turbo stream, an encoder that convolution-encodes the detected data bits, and a bit inserter that inserts an encoded value outputted from the encoder into the parity insertion region in the turbo stream. The encoder includes a first register; a second register, in which when a bit value is stored in the first register, a stored value pre-stored in the first register is shifted and stored; a third register, in which when a bit value is stored in the second register, a stored value pre-stored in the second register is shifted and stored; a first adder adding the input bit value, the stored value pre-stored in the first register, and the stored value pre-stored in the third register, and storing the resultant value of addition in the first register, if a specified bit is inputted; and a second adder adding the input bit value, the stored value pre-stored in the first register, and the stored value pre-stored in the second register to output the resultant value of addition. Accordingly, only the turbo stream in the dual transport stream is robustly processed.

23 Claims, 5 Drawing Sheets

U.S. PATENT DOCUMENTS

| | | | |
|---|---|---|---|
| 6,621,873 B1 * | 9/2003 | Lee et al. | 375/295 |
| 6,831,514 B2 * | 12/2004 | Waller et al. | 330/255 |
| 6,963,618 B2 | 11/2005 | Citta et al. | |
| 6,987,543 B1 * | 1/2006 | Mogre et al. | 348/608 |

FOREIGN PATENT DOCUMENTS

| | | |
|---|---|---|
| KR | 2004-14977 | 2/2004 |
| WO | WO 02/03678 | 1/2002 |
| WO | WO 03/003747 | 1/2003 |
| WO | WO 2004/023818 | 3/2004 |
| WO | WO 2004/062183 | 7/2004 |

OTHER PUBLICATIONS

U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/508,144, filed Aug. 23, 2006, Jung-pil Yu et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
Korean Office Action issued on Aug. 30, 2007, in Korean Patent Application No. 2006-68053 (in Korean, no English translation).
Office Action issued in corresponding Chinese Patent Application No. 200680037115.1 dated Apr. 10, 2009.

* cited by examiner

OUTER ENCODER AND OUTER ENCODING METHOD THEREOF

CROSS-REFERENCE TO RELATED APPLICATIONS

This application claims the benefit of U.S. Patent Application Nos. 60/728,777, filed on Oct. 21, 2005, 60/734,295, filed on Nov. 8, 2005, 60/738,050, filed on Nov. 21, 2005, 60/739,448, filed on Nov. 25, 2005, 60/788,707, filed on Apr. 4, 2006, and Korean Patent Application No. 2006-68053, filed on Jul. 20, 2006, in the Korean Intellectual Property Office, the disclosures of which are incorporated herein by reference.

BACKGROUND OF THE INVENTION

1. Field of the Invention

Aspects of the present invention relate to an outer encoder and an outer encoding method thereof that robustly process a digital broadcasting transport stream, and more particularly, to an outer encoder and an outer encoding method thereof that generate and transmit a dual transport stream including a normal stream and a turbo stream in order to improve the receiving performance of the ATSC (Advanced Television Systems Committee) VSB (Vestigial Side Band) system that is the American-type digital terrestrial broadcasting system, and which encode the turbo stream so as to transmit the turbo stream more robustly.

2. Description of the Related Art

An ATSC (Advanced Television Systems Committee) VSB system, which is an American-type digital terrestrial broadcasting system, is a signal carrier type broadcasting system and uses a field sync signal having a unit of 312 segments. Accordingly, its receiving performance is not good in an inferior channel, and particularly, in a Doppler fading channel.

Figure 1:
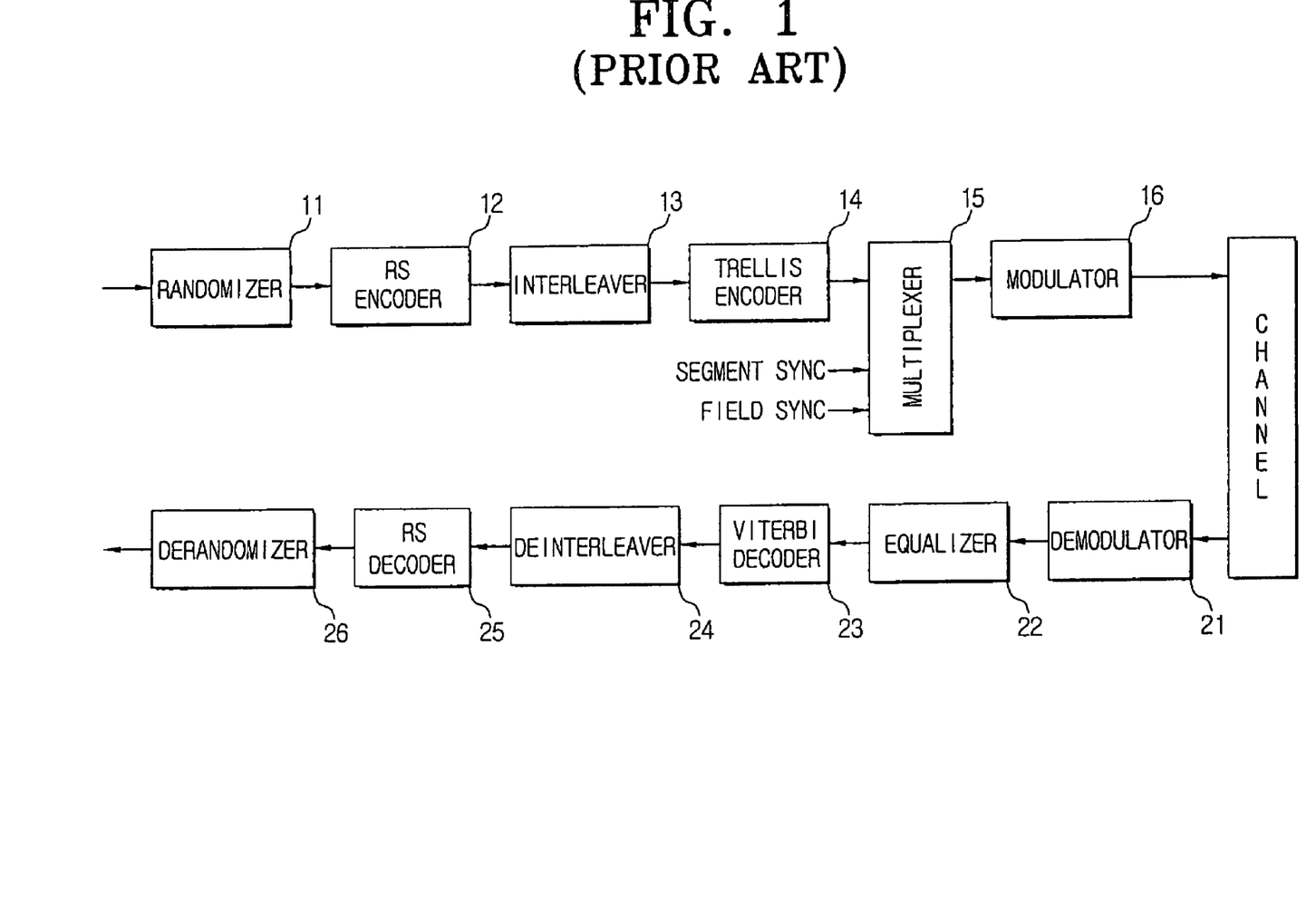
FIG. 1 is a block diagram illustrating the construction of a transmitting/receiving system of a general American-type digital broadcasting (ATSC VSB) system.

FIG. 1 is a block diagram illustrating the construction of a transmitter/receiver of an ATSC DTV standard as a general American-type digital terrestrial broadcasting system. The digital broadcast transmitter of FIG. 1 is an enhanced VSB (EVSB) system proposed by Philips that forms and transmits a dual stream provided by adding robust data to normal data of the basic ATSC VSB system.

As illustrated in FIG. 1, the digital broadcast transmitter includes a randomizer 11, which randomizes a dual stream, an RS (Reed-Solomon) encoder 12 in the form of a concatenated coder that adds parity bytes to the transport stream in order to correct errors occurring due to the channel characteristic in a transport process, an interleaver 13, which interleaves the RS-encoded data according to a specified pattern, and a ⅔-rate trellis encoder 14, which maps the interleaved data onto 8-level symbols by performing a ⅔-rate trellis encoding of the interleaved data. The digital broadcast transmitter performs an error correction coding of the dual stream.

Figure 2:
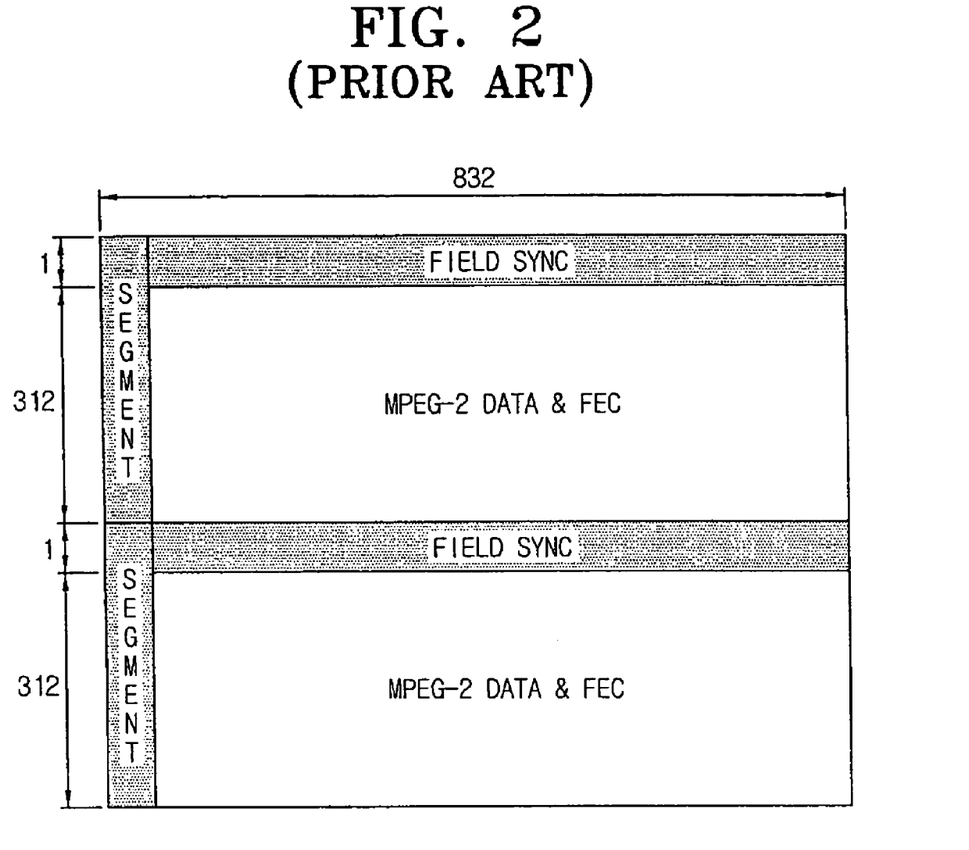
FIG. 2 is a view illustrating the structure of an ATSC VSB data frame.

The digital broadcast transmitter further includes a multiplexer 15, which inserts a field sync signal and a segment sync signal into the error-correction-coded data as a data format in FIG. 2, and a modulator 16, which inserts a pilot tone into the data symbols into which the segment sync signal and the field sync signal have been inserted by adding specified DC values to the data symbols, performing a VSB modulation of the data symbols by pulse-shaping the data symbols and up-converting the modulated data symbols into an RF channel band signal to transmit the RF channel band signal.

In the digital broadcast transmitter, the normal data and the robust data are multiplexed (not illustrated) according to a dual stream system that transmits the normal data and the robust data through one channel, and the multiplexed data is inputted to the randomizer 11. The input data is randomized through the randomizer 11, outer-encoded through the RS encoder 120, which is an outer encoder, and then distributed through the interleaver 13. Also, the interleaved data is inner-encoded with a unit of 12 symbols through the trellis encoder 14, and then mapped onto the 8-level symbols. After the field sync signal and the segment sync signal are inserted into the coded data, the data is VSB-modulated by inserting a pilot tone into the data, and is converted into an RF signal.

The digital broadcast receiver of FIG. 1 includes a tuner (not illustrated) that converts an RF signal received through a channel into a baseband signal, a demodulator 21, which performs a sync detection and demodulation of the converted baseband signal, an equalizer 22, which compensates for channel distortion of the demodulated signal occurring due to multipath conditions, a Viterbi decoder 23, which corrects errors of the equalized signal and decodes the error-corrected signal to symbol data, a deinterleaver 24, which rearranges the data distributed by the interleaver 13 of the digital broadcast transmitter, an RS decoder 25, which corrects errors, and a derandomizer 26, which derandomizes the data corrected through the RS decoder 25 and outputs an MPEG-2 transport stream.

Accordingly, the digital broadcast receiver of FIG. 1 down-converts the RF signal into the baseband signal, demodulates and equalizes the converted signal, and then channel-decodes the demodulated signal to restore the original signal.

FIG. 2 illustrates a VSB data frame for use in the American type digital broadcasting (8-VSB) system, into which a segment sync signal and a field sync signal are inserted. As shown in FIG. 2, one frame is composed of two fields, and each field is composed of one field sync segment, which is the first segment, and 312 data segments. Also, each segment in the VSB data frame corresponds to one MPEG-2 packet and is composed of a segment sync signal of four symbols and 828 data symbols.

The segment sync signal and the field sync signal illustrated in FIG. 2 are used for synchronization and equalization in the digital broadcast receiver. That is, the field sync signal and the segment sync signal refer to known data between the digital broadcast transmitter and receiver, which known data is used as a reference signal when equalization is performed in the receiver side.

The American type digital terrestrial broadcasting system as illustrated in FIG. 1 is a system that can form and transmit a dual stream that is produced by adding the robust data to the normal data of the existing ATSC VSB system. This system transmits the robust data together with the existing normal data.

However, the American type digital terrestrial broadcasting system of FIG. 1 has the problem that it has almost no effect of improving the inferior receiving performance in a multipath channel in the transmission of the existing normal data, although it transmits the dual stream produced by adding the robust data to the normal data.

That is, it has almost no effect of improving the receiving performance according to an improvement of the normal stream. Also, even with respect to a turbo stream, it does not have a great effect of improving the receiving performance in a multipath environment.

Consequently, it is desirable to process the turbo stream more robustly so as to improve the receiving performance for the turbo stream.

SUMMARY OF THE INVENTION

Aspects of the present invention have been developed in order to solve the above drawbacks and other problems associated with the conventional arrangement. An aspect of the present invention is to provide an outer encoder and an outer encoding method thereof which encode a turbo stream of a dual transport stream that is provided with a normal stream and the turbo stream in order to improve the receiving performance of an ATSC (Advanced Television Systems Committee) VSB (Vestigial Side Band) system (an American-type digital terrestrial broadcasting system).

The foregoing and/other aspects and advantages are substantially realized by providing an outer encoder according to aspects of the present invention that includes a bit detector that receives a turbo stream provided with a parity insertion region and that detects data bits from the turbo stream, an encoder that convolution-encodes the detected data bits, and a bit inserter that inserts an encoded value outputted from the encoder into the parity insertion region in the turbo stream.

According to an aspect of the present invention, the encoder may include a first register; a second register, into which when a bit value is stored in the first register, a stored value pre-stored in the first register is shifted and stored; a third register, into which, when a bit value is stored in the second register, a stored value pre-stored in the second register is shifted and stored; a first adder that when a specified bit is inputted, adds the input bit value, the stored value pre-stored in the first register, and a stored value pre-stored in the third register, and stores the resultant value of addition in the first register; and a second adder that adds the input bit value, the stored value pre-stored in the first register, and the stored value pre-stored in the second register to output the resultant value of addition.

According to an aspect of the present invention, the encoder may receive an input of the data bits detected by the bit detector one by one in reverse order to a detection order, and perform a convolution-encoding of the data bits.

According to an aspect of the present invention, the bit inserter may insert an encoded value convolution-encoded by and outputted from the encoder into the parity insertion region one by one in reverse order to an encoding order.

According to an aspect of the present invention, the parity insertion region may be made up of one bit arranged in succession for each data bit of the turbo stream.

According to an aspect of the present invention, the parity insertion region may be made up of three bits arranged in succession for each data bit of the turbo stream.

According to an aspect of the present invention, with respect to each data bit of the turbo stream, the bit inserter may insert the encoded value of the data bit into first and third bits among the three bits of the parity insertion region arranged in succession, and insert the same bit value as that of the data bit into the second bit among the three bits of the parity insertion region.

According to another aspect of the present invention, an outer encoder comprises a bit detector that receives a dual transport stream comprising a normal stream and a turbo stream, wherein the turbo stream provided with a parity insertion region and that detects data bits from only the turbo stream; an encoder that convolution-encodes the detected data bits and, for each detected data bit, outputs an encoded value; and a bit inserter that inserts the encoded value outputted from the encoder into the parity insertion region in the turbo stream.

In another aspect of the present invention, there is provided an outer encoding method, which includes receiving a dual transport stream including a turbo stream provided with a parity insertion region, and detecting data bits only from the turbo stream, convolution-encoding the data bits using an encoder provided with a plurality of registers and a plurality of adders to output an encoded value for each data bit, and inserting the encoded value into the parity insertion region.

According to an aspect of the present invention, the encoder may include a first register; a second register, into which, when a bit value is stored in the first register, a stored value pre-stored in the first register is shifted and stored; a third register, into which when a bit value is stored in the second register, a stored value pre-stored in the second register is shifted and stored; a first adder that, when a specified bit is inputted, adds the input bit value, the stored value pre-stored in the first register, and a stored value pre-stored in the third register, and stores the resultant value of addition in the first register; and a second adder that adds the input bit value, the stored value pre-stored in the first register, and the stored value pre-stored in the second register to output the resultant value of addition.

According to an aspect of the present invention, the parity insertion region may be made up of one bit arranged in succession for each data bit of the turbo stream.

According to an aspect of the present invention, the parity insertion region may be made up of three bits arranged in succession for each data bit of the turbo stream.

According to an aspect of the present invention, in inserting the encoded value into the parity insertion region, the encoded value of each data bit may be inserted into first and third bits among three bits of the parity insertion region arranged in succession, and the same bit value as that of each data bit may be inserted into the second bit among the three bits of the parity insertion region.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
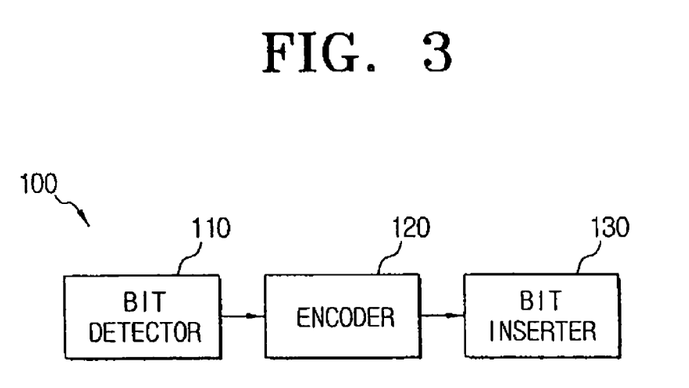
FIG. 3 is a block diagram illustrating the construction of an outer encoder according to an embodiment of the present invention.

FIG. 3 is a block diagram illustrating the construction of an outer encoder 100 according to an embodiment of the present invention. Referring to FIG. 3, the outer encoder 100 includes a bit detector 110, an encoder 120, and a bit inserter 130. The outer encoder 100 performs outer encoding of only a turbo stream included in a dual transport stream in which the turbo stream and a normal stream are mixed. The turbo stream is a data stream that is compressed according to a specified compression standard such as MPEG-2 and is robustly processed.

The bit detector 110 receives the turbo stream, which has a parity inserting region formed therein to insert parity, and detects only the data bit from the turbo stream. The bit detector 110 detects a bit that is not in the parity insertion region as being the data bit. More particularly, the bit detector 110 detects a specified number of data bits according to a conversion ratio of the turbo stream. That is, in the case of a turbo stream provided with a parity insertion region in the ½ conversion ratio, four data bits are detected from one byte. In the case of a turbo stream provided with a parity insertion region in a ¼ conversion ratio, two data bits are detected from one byte.

The encoder 120 convolution-codes the detected data bit in the form of a recursive systematic convolutional code (RSC code).

The bit inserter 130 inserts the encoded value outputted from the encoder 120 into the parity insertion region in the turbo stream.

Figure 4:
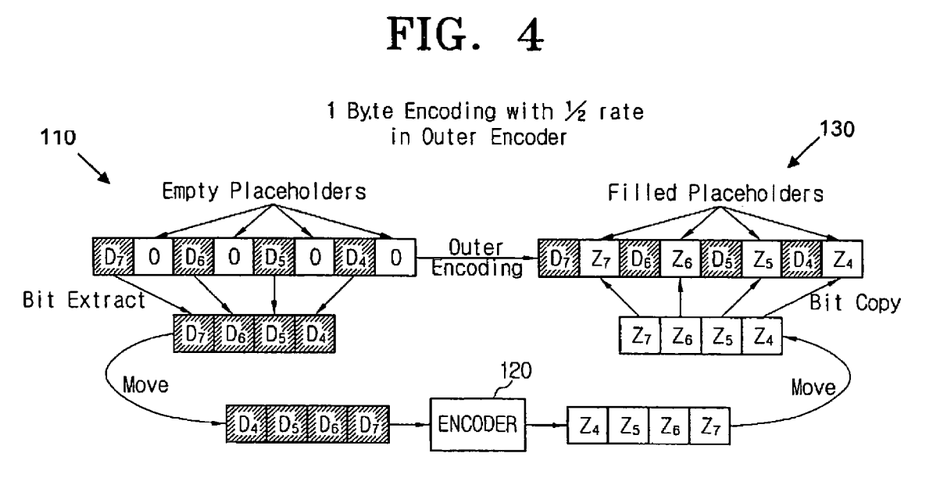
FIGS. 4 and 5 are views explaining various encoding methods of the outer encoder in FIG. 3.
Figure 5:
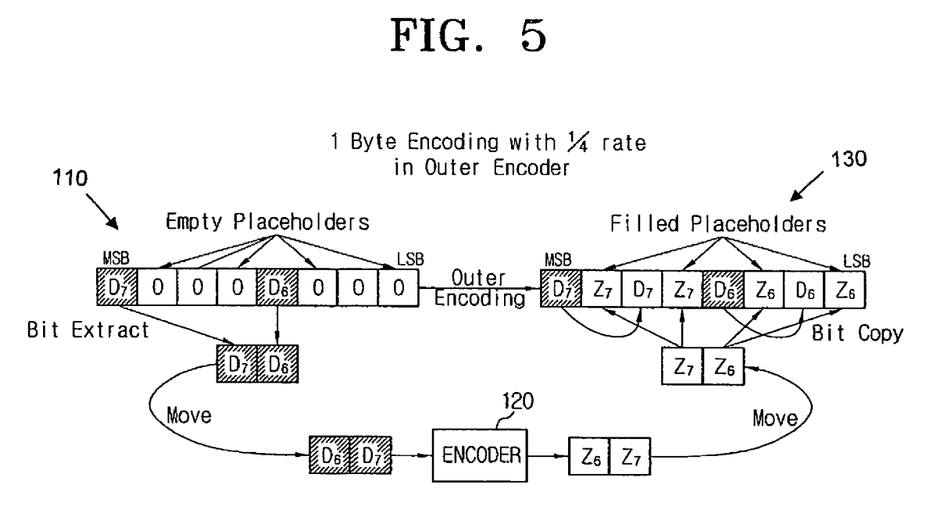

FIGS. 4 and 5 are views explaining various encoding methods of the outer encoder.

FIG. 4 is a view explaining the process of encoding data at a ½ rate. Referring to FIG. 4, the bit detector 110 detects bits D7, D6, D5, and D4 from one byte composed of D7 0 D6 0 D5 0 D4 0 D 0. The portion denoted by 0 in FIG. 4 is a region into which the parity will be inserted, that is, a parity insertion region (also called a placeholder). In other words, the parity insertion region composed of one bit is provided for each bit of one byte.

The bit detector 110 arranges the detected bits in reverse order to the detection order, and inserts the bits into the encoder 120 one by one. That is, for example, if the bits are detected in the order of D4, D5, D6, and D7, the bits are inserted into the encoder 120 in the order of D7, D6, D5, and D4.

The encoder 120 successively outputs encoded values Z7, Z6, Z5, and Z4 which correspond to D7, D6, D5, and D4.

[0041] The bit inserter 130 arranges the encoded values in reverse order to their output order, and inserts the encoded values into the parity insertion region. That is, for example, if the encoded values are output in the order of Z7, Z6, Z5, and Z4, the encoded values are inserted into the parity insertion region in the order of Z4, Z5, Z6, and Z7. As a result, the outer encoder 100 encodes the byte of D7 0 D6 0 D5 0 D4 0 D 0 to output the byte in the form of D7 Z7 D6 Z6 D5 Z5 D4 Z4.

FIG. 5 is a view explaining the process of encoding data at a ¼ rate. Referring to FIG. 5, each byte of the turbo stream is composed of one data bit and three null bits arranged in succession to the data bit. Specifically, two data bits D7 and D6, and 6 null bits constitute one byte.

Referring to FIG. 5, the bit detector 110 successively detects the bits D6 and D7 from one byte composed of D7 0 0 0 D6 0 0 0. The bit detector 110 arranges the detected bits in the order of D7 and D6 and inserts the bits into the encoder 120. The encoder 120 outputs encoded values Z7 and Z6 which correspond to D7 and D6.

The bit inserter 130 arranges the encoded values Z7 and Z6 in reverse order to their output order, and inserts the encoded values into the parity insertion region in the order of Z6 and Z7. In this instance, each encoded value is inserted into the first and third bits of the parity insertion region composed of one data bit and three successive bits. Also, the same value as the respective data bit is copied to the second bit of the parity insertion region. As a result, if the byte composed of D7 0 0 0 D6 0 0 0 is encoded, a byte of D7 Z7 D7 Z7 D6 Z6 D6 Z6 is outputted.

FIGS. 4 and 5 show the parity insertion region recorded with zero data. However, it is to be understood that the parity insertion region may be recorded with simple null data that is not zero.

Figure 6:
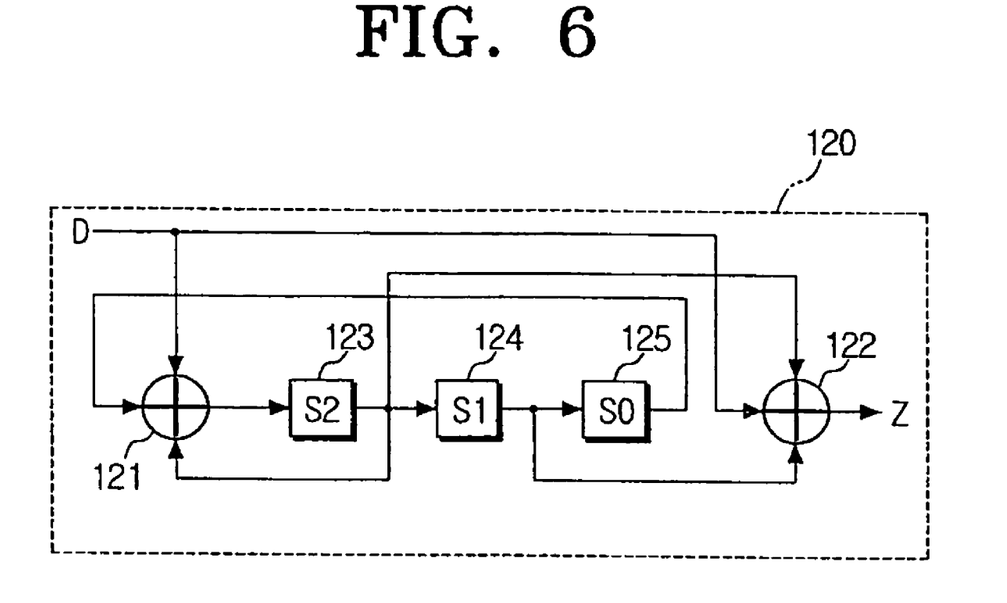
FIG. 6 is a view illustrating an example of the detailed construction of an encoder of the outer encoder in FIG. 3.

FIG. 6 is a view illustrating the construction of the encoder unit of the outer encoder 120 according to an embodiment of the present invention. Referring to FIG. 6, the encoder 120 includes first and second adders 121 and 122, and three registers (S2, S1, and S0) 123, 124, and 125.

The first adder 121 adds a bit value D to be input, a stored value of the first register (S2) 123, and a stored value of the third register (S0) 125, and stores the resultant value of addition in the first register (S2) 123. The value pre-stored in the first register (S2) 123 is shifted and stored in the second register (S1) 124. In this instance, the value pre-stored in the first register (S2) 123 is provided to the second adder 122. The second adder 122 adds the stored value of the first register (S2) 123, the value pre-stored in the second register (S1) 124, and the bit value D to be input, and outputs the resultant value, which is the encoded value Z. Meanwhile, the value pre-stored in the second register (S1) 124 is shifted and stored in the third register (S0) 125. The value stored in the third register (S0) is provided to the first adder 121. Thus, the RSC code type of convolution encoding is performed.

The outer encoder 100 shown in FIG. 3 may be used in a digital broadcast transmitting system that generates and transmits a dual transport steam. The digital broadcast transmitting system may include a MUX end (not shown) that multiplexes the normal stream and the turbo stream to generate the dual transport stream, and an exciter end (not shown) that robustly processes only the turbo stream in the generated dual transport stream, performs encoding and modulation of the dual transport stream, and transmits the encoded and modulated stream. The outer encoder 100 in FIG. 3 can be adapted to the turbo stream processing apparatus such that the outer encoder 100 detects only the turbo stream in the exciter end and robustly processes the detected stream.

Figure 7:
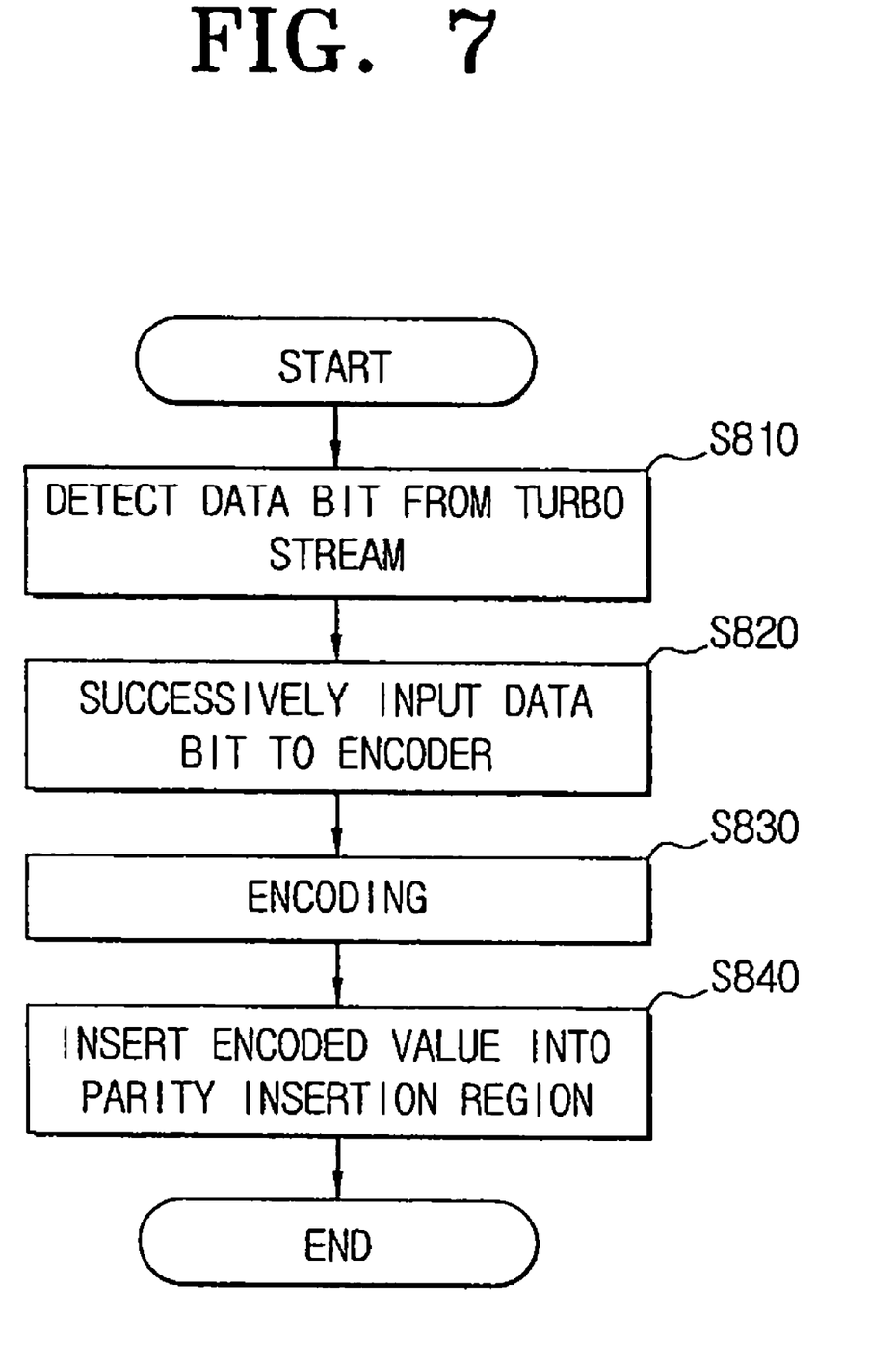
FIG. 7 is a view explaining illustrating an outer encoding method according to an embodiment of the present invention.

FIG. 7 is a flowchart explaining the outer encoding method according to an embodiment of the present invention. Referring to FIG. 7, the outer encoding method first detects the data bit from the turbo stream (S810). The detected positions and number of the data bits may be changed depending upon the conversion method. More specifically, when the ½ rate conversion method is used, four data bits, that is, the 2nd, 4th, 6th, and 8th bits from the rightmost side, are detected from one byte. When the ¼ rate conversion method is used, two data bits, that is, the 4th and 8th bits from the rightmost side, are detected from one byte.

Then, the detected data bits are successively inputted to the encoder (S820). The encoder may employ the construction as shown in FIG. 6.

The encoder performs the encoding of the data bits in an input order of the data bits (S830). Then, the encoded value is inserted into the parity insertion region (S840). Accordingly, the outer encoding process is completed.

As described above, according to aspects of the present invention, it is possible to effectively encode only the turbo stream in a dual transport stream that includes a normal stream and a turbo stream in order to improve the receiving performance of a ATSC (Advanced Television Systems Committee) VSB (Vestigial Side Band) system that is an American-type digital terrestrial broadcasting system. Therefore, it is possible for only the turbo stream in the dual transport stream to be robustly processed, thereby improving the receiving performance in multipath environments.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An outer encoder comprising:
   a bit detector that receives a turbo stream provided with a parity insertion region and that detects data bits from the turbo stream;
   an encoder that convolution-encodes the detected data bits and, for each detected data bit, outputs an encoded value; and
   a bit inserter that inserts the encoded value outputted from the encoder into the parity insertion region in the turbo stream.

2. The outer encoder of claim 1, wherein the encoder comprises:
   a first register;
   a second register, into which, when a bit value is stored in the first register, a stored value pre-stored in the first register is shifted and stored;
   a third register, into which, when a bit value is stored in the second register, a stored value pre-stored in the second register is shifted and stored;
   a first adder that when a specified bit is inputted, adds the input bit value, the stored value pre-stored in the first register, and a stored value pre-stored in the third register, and stores a first resultant value of addition in the first register; and
   a second adder that adds the input bit value, the stored value pre-stored in the first register, and the stored value pre-stored in the second register to output a second resultant value of addition as the encoded value.

3. The outer encoder of claim 2, wherein the parity insertion region is made up of one bit arranged in succession for each data bit of the turbo stream.

4. The outer encoder of claim 2, wherein the parity insertion region is made up of three bits arranged in succession for each data bit of the turbo stream.

5. The outer encoder of claim 4, wherein, with respect to each data bit of the turbo stream, the bit inserter inserts the encoded value of the data bit into first and third bits among the three bits of the parity insertion region arranged in succession and inserts the same bit value as that of the data bit into the second bit among the three bits of the parity insertion region.

6. The outer encoder of claim 1, wherein the encoder receives an input of the data bits detected by the bit detector one by one in reverse order to a detection order, and performs a convolution-encoding of the data bits.

7. The outer encoder of claim 6, wherein the bit inserter inserts the encoded value convolution-encoded by and outputted from the encoder into the parity insertion region one by one in reverse order to an encoding order.

8. The outer encoder of claim 1, wherein the parity insertion region is made up of one bit arranged in succession for each data bit of the turbo stream.

9. The outer encoder of claim 1, wherein the parity insertion region is made up of three bits arranged in succession for each data bit of the turbo stream.

10. The outer encoder of claim 9, wherein, with respect to each data bit of the turbo stream, the bit inserter inserts the encoded value of the data bit into first and third bits among the three bits of the parity insertion region arranged in succession and inserts the same bit value as that of the data bit into the second bit among the three bits of the parity insertion region.

11. The outer encoder of claim 1, wherein the parity insertion region is recorded with zero data when the turbo stream is received by the bit detector.

12. The outer encoder of claim 1, wherein the parity insertion region is recorded with non-zero null data when the turbo stream is received by the bit detector.

13. An outer encoder comprising:
   a bit detector that receives a dual transport stream comprising a normal stream and a turbo stream, wherein the turbo stream is provided with a parity insertion region and that detects data bits from only the turbo stream;
   an encoder that convolution-encodes the detected data bits and, for each detected data bit, outputs an encoded value; and
   a bit inserter that inserts the encoded value outputted from the encoder into the parity insertion region in the turbo stream.

14. An outer encoding method comprising:
   receiving a dual transport stream including a turbo stream provided with a parity insertion region, and detecting data bits only from the turbo stream;
   convolution-encoding the data bits using an encoder provided with a plurality of registers and a plurality of adders and outputting an encoded value for each data bit; and
   inserting the encoded value into the parity insertion region.

15. The outer encoding method of claim 14, wherein the encoder comprises:
   a first register;
   a second register, into which, when a bit value is stored in the first register, a stored value pre-stored in the first register is shifted and stored;
   a third register, into which, when a bit value is stored in the second register, a stored value pre-stored in the second register is shifted and stored;
   a first adder that, when a specified bit is inputted, adds the input bit value, the stored value pre-stored in the first register, and a stored value pre-stored in the third register, and stores a first resultant value of addition in the first register; and
   a second adder that adds the input bit value, the stored value pre-stored in the first register, and the stored value pre-stored in the second register to output a second resultant value of addition as the encoded value.

16. The outer encoding method of claim 15, wherein in the parity insertion region, one bit is arranged in succession for each data bit of the turbo stream.

17. The outer encoding method of claim 15, wherein in the parity insertion region, three bits are arranged in succession for each data bit of the turbo stream.

18. The outer encoding method of claim 17, wherein in inserting the encoded value into the parity insertion region, the encoded value of each data bit is inserted into first and third bits among three bits of the parity insertion region arranged in succession and the same bit value as that of the data bit is inserted into the second bit among the three bits of the parity insertion region.

19. The outer encoding method of claim 14, wherein in the parity insertion region, one bit is arranged in succession for each data bit of the turbo stream.

20. The outer encoding method of claim 14, wherein in the parity insertion region, three bits are arranged in succession for each data bit of the turbo stream.

21. The outer encoding method of claim 20, wherein in inserting the encoded value into the parity insertion region, the encoded value of each data bit is inserted into first and third bits among three bits of the parity insertion region arranged in succession and the same bit value as that of the data bit is inserted into the second bit among the three bits of the parity insertion region.

22. The outer encoding method of claim 14, wherein the parity insertion region is recorded with zero data when the turbo stream is received by the bit detector.

23. The outer encoding method of claim 14, wherein the parity insertion region is recorded with non-zero null data when the turbo stream is received by the bit detector.

* * * * *